United States Patent
Hwang

(10) Patent No.: US 11,417,399 B2
(45) Date of Patent: Aug. 16, 2022

(54) MEMORY DEVICE AND METHOD OF OPERATING THE SAME

(71) Applicant: SK hynix Inc., Gyeonggi-do (KR)

(72) Inventor: Sung Hyun Hwang, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 0 days.

(21) Appl. No.: 17/145,788

(22) Filed: Jan. 11, 2021

(65) Prior Publication Data

US 2022/0005532 A1    Jan. 6, 2022

(30) Foreign Application Priority Data

Jul. 3, 2020    (KR) .......................... 10-2020-0082372

(51) Int. Cl.
| | |
|---|---|
| G11C 16/10 | (2006.01) |
| G11C 16/26 | (2006.01) |
| G11C 16/30 | (2006.01) |
| G11C 16/34 | (2006.01) |
| G11C 16/24 | (2006.01) |
| G11C 16/04 | (2006.01) |
| G11C 16/08 | (2006.01) |

(52) U.S. Cl.
CPC .......... G11C 16/10 (2013.01); G11C 16/0483 (2013.01); G11C 16/08 (2013.01); G11C 16/24 (2013.01); G11C 16/26 (2013.01); G11C 16/30 (2013.01); G11C 16/3454 (2013.01)

(58) Field of Classification Search
CPC ....................................................... G11C 16/10
USPC ................................................... 365/185.18
See application file for complete search history.

(56) References Cited

U.S. PATENT DOCUMENTS

2016/0343450 A1* 11/2016 Lee ................... H01L 27/11524

FOREIGN PATENT DOCUMENTS

| KR | 10-2011-0120467 | 11/2011 |
| KR | 10-2020-0084262 | 7/2020 |

* cited by examiner

*Primary Examiner* — Jason Lappas
(74) *Attorney, Agent, or Firm* — IP & T Group LLP

(57) ABSTRACT

The present technology relates to an electronic device. According to the present technology, a method of operating a memory device including a program operation speed in which an effect of a disturbance is reduced, and including a plurality of memory blocks each including a plurality of memory cell strings each including a plurality of memory cells connected in series between a bit line and a source line, a plurality of source select transistors connected in series between the source line and the plurality of memory cells, and a plurality of drain select transistors connected in series between the bit line and the plurality of memory cells, includes applying a precharge voltage to the source line, and applying the precharge voltage to a first source select line connected to a source select transistor adjacent to the source line among source select transistors included in an unselected memory block among the plurality of memory blocks.

20 Claims, 14 Drawing Sheets

MEMORY DEVICE AND METHOD OF OPERATING THE SAME

CROSS-REFERENCE TO RELATED APPLICATION

The present application claims priority under 35 U.S.C. § 119(a) to Korean patent application number 10-2020-0082372, filed on Jul. 3, 2020, which is incorporated herein by reference in its entirety.

BACKGROUND

1. Field of Invention

The present disclosure relates to an electronic device, and, more particularly, to a memory device and a method of operating the same.

2. Description of Related Art

A storage device is a device that stores data under control of a host device such as a computer or a smartphone. The storage device may include a memory device storing data and a memory controller controlling the memory device. The memory device may be classified into a volatile memory device and a non-volatile memory device.

The volatile memory device may be a device that stores data only when power is supplied and loses the stored data when the power supply is cut off. The volatile memory device may include a static random access memory (SRAM), a dynamic random access memory (DRAM), and the like.

The non-volatile memory device is a device that does not lose data even though power is cut off. The non-volatile memory device includes a read only memory (ROM), a programmable ROM (PROM), an electrically programmable ROM (EPROM), an electrically erasable and programmable ROM (EEPROM), a flash memory, and the like.

SUMMARY

An embodiment of the present disclosure provides a memory device having a program operation speed in which an effect of a disturbance is reduced, and a method of operating the same.

According to an embodiment of the present disclosure, a method of operating a memory device, which includes a plurality of memory blocks each including a plurality of memory cell strings each including a plurality of memory cells connected in series between a bit line and a source line, a plurality of source select transistors connected in series between the source line and the plurality of memory cells, and a plurality of drain select transistors connected in series between the bit line and the plurality of memory cells, includes applying a precharge voltage to the source line, and applying the precharge voltage to a first source select line connected to a source select transistor adjacent to the source line among source select transistors included in an unselected memory block among the plurality of memory blocks.

According to an embodiment of the present disclosure, a memory device includes a plurality of memory blocks each including a plurality of memory cell strings each including a plurality of memory cells connected in series between a bit line and a source line, a plurality of source select transistors connected in series between the source line and the plurality of memory cells, and a plurality drain select transistors connected in series between the bit line and the plurality of memory cells, a peripheral circuit configured to perform a plurality of program loops including a program step of providing a program voltage to a selected memory block among the plurality of memory blocks and a verify step of verifying a program state of the selected memory block, and a program operation controller configured to control the peripheral circuit to apply a precharge voltage to the source line and apply the precharge voltage to a first source select line connected to a source select transistor adjacent to the source line among source select transistors included in an unselected memory block among the plurality of memory blocks in the program step.

According to an embodiment of the present disclosure, a method of operating a memory device, which includes a plurality of memory blocks each including a plurality of memory cell strings each including a plurality of memory cells connected in series between a bit line and a source line, a plurality of source select transistors connected in series between the source line and the plurality of memory cells, and a plurality of drain select transistors connected in series between the bit line and the plurality of memory cells, includes applying a precharge voltage to the source line, and applying the precharge voltage to a first source select line connected to a source select transistor adjacent to the source line among source select transistors included in an unselected memory block among the plurality of memory blocks, after the source line is precharged to a first voltage level.

According to an embodiment of the present disclosure, a method of programming a nonvolatile memory cell string coupled to at least a source line and including at least source select transistors, the method including: applying a precharge voltage to the source line during a precharge period, and applying, during the precharge period, the precharge voltage to a source select line coupled to an adjacent source select transistor after the applying of the precharge voltage to the source line, wherein the adjacent source select transistor is most adjacent to the source line among the source select transistors.

According to the present technology, a memory device having a program operation speed in which an effect of a disturbance is reduced, and a method of operating the same are provided.

DETAILED DESCRIPTION

Specific structural or functional descriptions which are disclosed in the present specification or application are illustrated only to describe the embodiments according to the present disclosure. The embodiments of the present disclosure may be carried out in various forms and the descriptions are not limited to the embodiments described in the present specification or application.

Figure 1:
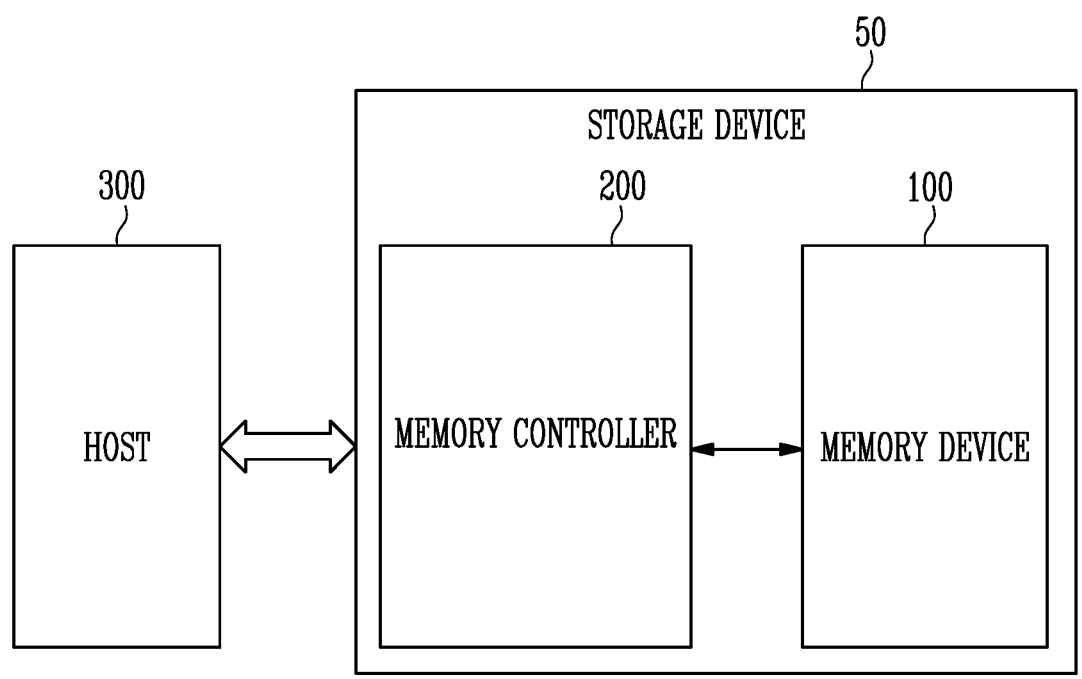
FIG. 1 is a diagram for describing a storage device according to an embodiment of the present disclosure.

FIG. 1 is a diagram for describing a storage device according to an embodiment of the present disclosure.

Referring to FIG. 1, the storage device 50 may include a memory device 100 and a memory controller 200 that controls an operation of the memory device. The storage device 50 may be a device that stores data under control of a host 300 such as a cellular phone, a smartphone, an MP3 player, a laptop computer, a desktop computer, a game player, a TV, a tablet PC, or an in-vehicle infotainment system.

The storage device 50 may be manufactured as one of various types of storage devices according to a host interface which is a communication method with the host 300. For example, the storage device 50 may be configured as any one of various types of storage devices such as an SSD, a multimedia card in a form of an MMC, an eMMC, an RS-MMC and a micro-MMC, a secure digital card in a form of an SD, a mini-SD and a micro-SD, a universal serial bus (USB) storage device, a universal flash storage (UFS) device, a personal computer memory card international association (PCMCIA) card type storage device, a peripheral component interconnection (PCI) card type storage device, a PCI express (PCI-E) card type storage device, a compact flash (CF) card, a smart media card, and a memory stick.

The storage device 50 may be manufactured as any one of various types of packages. For example, the storage device 50 may be manufactured as any one of various types of package types, such as a package on package (POP), a system in package (SIP), a system on chip (SOC), a multi-chip package (MCP), a chip on board (COB), a wafer-level fabricated package (WFP), and a wafer-level stack package (WSP).

The memory device 100 may store data. The memory device 100 operates under control of the memory controller 200. The memory device 100 may include a memory cell array (not shown) including a plurality of memory cells that store data.

Each of the memory cells may be configured as a single level cell (SLC) that stores one data bit, a multi-level cell (MLC) that stores two data bits, a triple level cell (TLC) that stores three data bits, or a quad level cell (QLC) capable of storing four data bits.

The memory cell array (not shown) may include a plurality of memory blocks. One memory block may include a plurality of pages. In an embodiment, the page may be a unit for storing data in the memory device 100 or reading data stored in the memory device 100. The memory block may be a unit for erasing data.

In an embodiment, the memory device 100 may be a double data rate synchronous dynamic random access memory (DDR SDRAM), a low power double data rate 4 (LPDDR4) SDRAM, a graphics double data rate (GDDR) SDRAM, a low power DDR (LPDDR), a Rambus dynamic random access memory (RDRAM), a NAND flash memory, a vertical NAND flash memory, a NOR flash memory device, a resistive random access memory (RRAM), a phase-change random access memory (PRAM), a magnetoresistive random access memory (MRAM), a ferroelectric random access memory (FRAM), a spin transfer torque random access memory (STT-RAM), or the like. In the present specification, for convenience of description, the memory device 100 is a NAND flash memory.

The memory device 100 is configured to receive a command CMD and an address ADDR from the memory controller 200 and access an area selected by an address in the memory cell array. The memory device 100 may perform an operation instructed by the command CMD on the area selected by the address ADDR. For example, the memory device 100 may perform a write operation (program operation), a read operation, and an erase operation. During the program operation, the memory device 100 may program data in the area selected by the address ADDR. During the read operation, the memory device 100 may read data from the area selected by the address ADDR. During the erase operation, the memory device 100 may erase data stored in the area selected by the address ADDR.

The memory controller 200 may control an overall operation of the storage device 50.

When power is applied to the storage device 50, the memory controller 200 may execute firmware (FW). When the memory device 100 is a flash memory device, the firmware (FW) may include a host interface layer (HIL) that controls communication with the host 300, a flash translation layer (FTL) that controls communication between the memory controller 200 and the host 300, and a flash interface layer (FIL) that controls communication with the memory device 100.

In an embodiment, the memory controller 200 may receive data and a logical block address (LBA) from the host 300 and may convert the LBA into a physical block address (PBA) indicating an address of memory cells in which data included in the memory device 100 is to be stored. In the present specification, the LBA and a "logic address" or a "logical address" may be used as having the same meaning. In the present specification, the PBA and a "physical address" may be used as having the same meaning.

The memory controller 200 may control the memory device 100 to perform the program operation, the read operation, the erase operation, or the like according to a request of the host 300. During the program operation, the memory controller 200 may provide a write command, the PBA, and data to the memory device 100. During the read operation, the memory controller 200 may provide a read command and the PBA to the memory device 100. During the erase operation, the memory controller 200 may provide an erase command and the PBA to the memory device 100.

In an embodiment, the memory controller 200 may generate a command, an address, and data independently regardless of the request from the host 300 and transmit the command, the address, and the data to the memory device 100. For example, the memory controller 200 may provide a command, an address, and data for performing a read operation and program operations to accompany performing wear leveling, read reclaim, garbage collection, and the like, to the memory device 100.

In an embodiment, the memory controller 200 may control at least two or more memory devices 100. In this case, the memory controller 200 may control the memory devices 100 according to an interleaving method to improve operation performance. The interleaving method may be a method of controlling operations for at least two memory devices 100 to overlap with each other.

The host 300 may communicate with the storage device 50 using at least one of various communication methods such as a universal serial bus (USB), a serial AT attachment (SATA), a serial attached SCSI (SAS), a high speed interchip (HSIC), a small computer system interface (SCSI), a peripheral component interconnection (PCI), a PCI express (PCIe), a nonvolatile memory express (NVMe), a universal flash storage (UFS), a secure digital (SD), a multi-media card (MMC), an embedded MMC (eMMC), a dual in-line memory module (DIMM), a registered DIMM (RDIMM), and a load reduced DIMM (LRDIMM).

Figure 2:
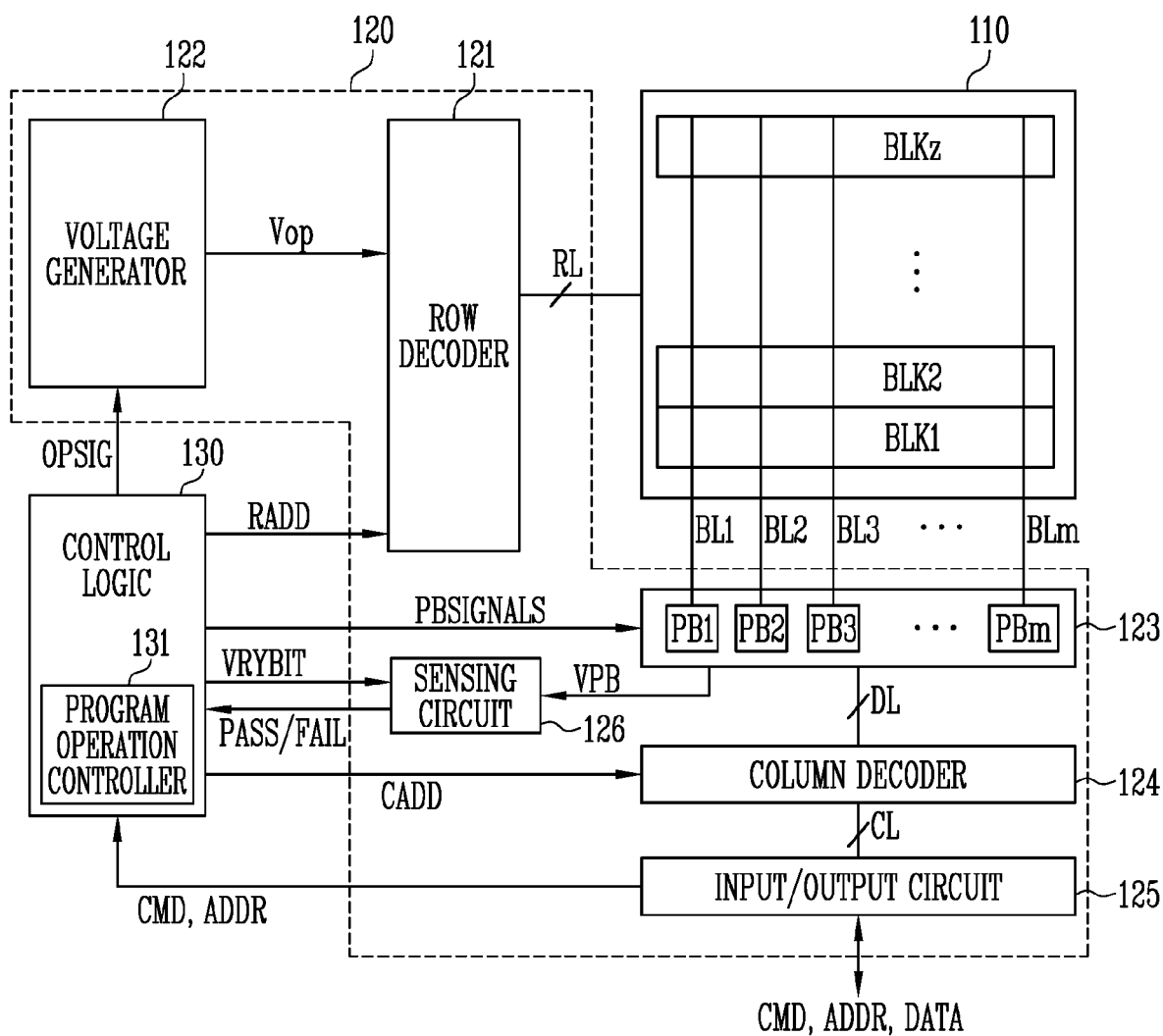
FIG. 2 is diagram for describing a memory device of FIG. 1.

FIG. 2 is diagram for describing the memory device 100 of FIG. 1.

Referring to FIG. 2, the memory device 100 may include a memory cell array 110, a peripheral circuit 120, and a control logic 130.

The memory cell array 110 includes a plurality of memory blocks BLK1 to BLKz. The plurality of memory blocks BLK1 to BLKz are connected to a row decoder 121 through row lines RL. The plurality of memory blocks BLK1 to BLKz may be connected to the page buffer group 123 through bit lines BL1 to BLm. Each of the plurality of memory blocks BLK1 to BLKz includes a plurality of memory cells. As an embodiment, the plurality of memory cells are non-volatile memory cells. Memory cells connected to the same word line may be defined as one page. Therefore, one memory block may include a plurality of pages.

The row lines RL may include at least one source select line, a plurality of word lines, and at least one drain select line.

Each of the memory cells included in the memory cell array 110 may be configured as a single level cell (SLC) that stores one data bit, a multi-level cell (MLC) that stores two data bits, a triple level cell (TLC) that stores three data bits, or a quad level cell (QLC) that stores four data bits.

The peripheral circuit 120 may be configured to perform the program operation, the read operation, or the erase operation on a selected region of the memory cell array 110 under control of the control logic 130. The peripheral circuit 120 may drive the memory cell array 110. For example, the peripheral circuit 120 may apply various operation voltages to the row lines RL and the bit lines BL1 to BLm or discharge the applied voltages under the control of the control logic 130.

The peripheral circuit 120 may include a row decoder 121, a voltage generator 122, the page buffer group 123, a column decoder 124, and an input/output circuit 125.

The row decoder 121 is connected to the memory cell array 110 through the row lines RL. The row lines RL may include at least one source select line, a plurality of word lines, and at least one drain select line. In an embodiment, the word lines may include normal word lines and dummy word lines. In an embodiment, the row lines RL may further include a pipe select line.

The row decoder 121 is configured to operate in response to control of the control logic 130. The row decoder 121 receives a row address RADD from the control logic 130.

The row decoder 121 is configured to decode the row address RADD received from the control logic 130. The row decoder 121 selects at least one memory block among the memory blocks BLK1 to BLKz according to a decoded address. In addition, the row decoder 121 may select at least one word line of the memory block selected to apply the voltages generated by the voltage generator 122 to at least one word line WL according to the decoded address.

For example, during the program operation, the row decoder 121 may apply a program voltage to a selected word line and apply a program pass voltage of a level lower than the program voltage to an unselected word line. During a program verify operation, the row decoder 121 may apply a verify voltage to the selected word line and a verify pass voltage higher than the verify voltage to the unselected word line. During the read operation, the row decoder 121 may apply a read voltage to the selected word line and apply a read pass voltage higher than the read voltage to the unselected word line.

In an embodiment, the erase operation of the memory device 100 is performed in a memory block unit. During the erase operation, the row decoder 121 may select one memory block according to the decoded address. During the erase operation, the row decoder 121 may apply a ground voltage to the word lines connected to the selected memory block.

The voltage generator 122 operates in response to the control of the control logic 130. The voltage generator 122 is configured to generate a plurality of voltages using an external power voltage supplied to the memory device 100. Specifically, the voltage generator 122 may generate various operation voltages Vop used for the program, read, and erase operations, in response to operation signal OPSIG. For example, the voltage generator 122 may generate the program voltage, the verify voltage, the pass voltage, the read voltage, the erase voltage, and the like in response to the control of the control logic 130.

In an embodiment, the voltage generator 122 may generate an internal power voltage by regulating the external power voltage. The internal power voltage generated by the voltage generator 122 is used as an operation voltage of the memory device 100.

In an embodiment, the voltage generator 122 may generate a plurality of voltages using the external power voltage or the internal power voltage.

For example, the voltage generator 122 may include a plurality of pumping capacitors that receive the internal power voltage, and may selectively activate the plurality of pumping capacitors to generate the plurality of voltages, in response to the control of the control logic 130.

The generated plurality of voltages may be supplied to the memory cell array 110 by the row decoder 121.

The page buffer group 123 includes first to m-th page buffers PB1 to PBm. The first to m-th page buffers PB1 to PBm are connected to the memory cell array 110 through the first to m-th bit lines BL1 to BLm, respectively. The first to m-th page buffers PB1 to PBm operate in response to the control of the control logic 130. Specifically, the first to m-th page buffers PB1 to PBm may operate in response to page buffer control signals PBSIGNALS. For example, the first to m-th page buffers PB1 to PBm may temporarily store data received through the first to m-th bit lines BL1 to BLm, or may sense a voltage or a current of the bit lines BL1 to BLm during the read or verify operation.

Specifically, during the program operation, when the program pulse is applied to the selected word line, the first to m-th page buffers PB1 to PBm may transfer data DATA received through the input/output circuit 125 to the selected memory cell through the first to m-th bit lines BL1 to BLm. The memory cells of the selected page are programmed according to the transferred data DATA. A memory cell connected to a bit line to which a program permission voltage (for example, a ground voltage) is applied may have an increased threshold voltage. The threshold voltage of the memory cell connected to the bit line to which a program inhibition voltage (for example, a power voltage) is applied may be maintained. During the program verify operation, the first to m-th page buffers PB1 to PBm may read page data from the selected memory cells through the first to m-th bit lines BL1 to BLm.

During the read operation, the first to m-th page buffers PB1 to PBm read the data DATA from the memory cells of the selected page through the first to m-th bit lines BL1 to BLm, and output the read data DATA to the input/output circuit 125 under the control of the column decoder 124.

During the erase operation, the first to m-th page buffers PB1 to PBm may float the first to m-th bit lines BL1 to BLm.

The column decoder 124 may transfer data between the input/output circuit 125 and the page buffer group 123 in response to a column address CADD. For example, the column decoder 124 may exchange data with the first to m-th page buffers PB1 to PBm through data lines DL, or may exchange data with the input/output circuit 125 through column lines CL.

The input/output circuit 125 may transfer the command CMD and the address ADDR received from the memory controller 200 described with reference to FIG. 1 to the control logic 130, or may exchange data DATA with the column decoder 124.

The sensing circuit 126 may generate a reference current in response to a permission bit signal VRYBIT during the read operation or the verify operation, and compare a sensing voltage VPB received from the page buffer group 123 with a reference voltage generated by the reference current to output a pass signal PASS or a fail signal FAIL.

The control logic 130 may output the operation signal OPSIG, the row address RADD, the page buffer control signals PBSIGNALS, and the permission bit VRYBIT in response to the command CMD and the address ADDR to control the peripheral circuit 120. In addition, the control logic 130 may determine whether the verify operation is passed or failed in response to the pass or fail signal PASS or FAIL.

In an embodiment, the control logic 130 may include a program operation controller 131.

The program operation controller 131 may control the peripheral circuit 120 to perform the program operation according to the program command input from the memory controller 200. The program operation performed by the program operation controller 131 is described in more detail with reference to FIGS. 9 and 10.

Figure 3:
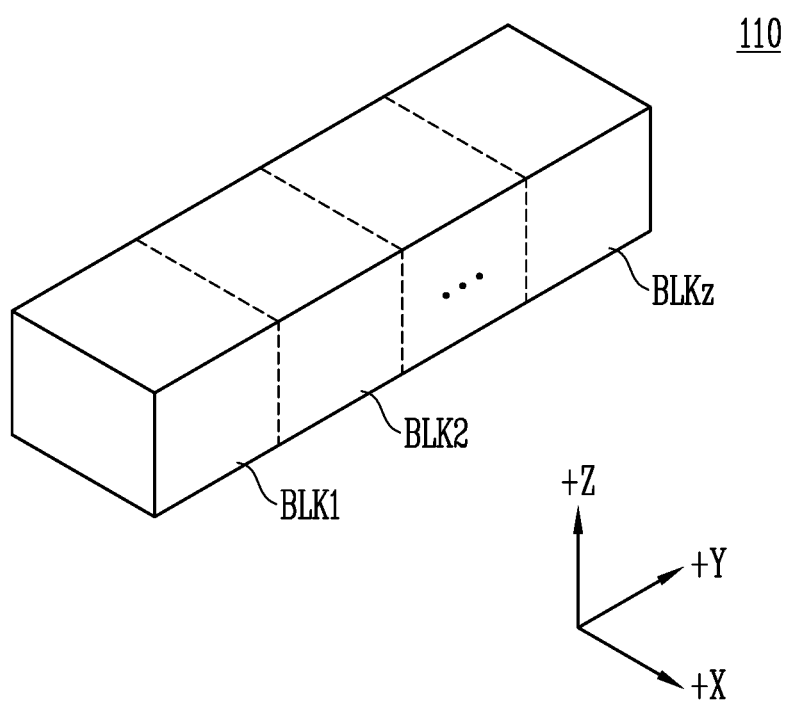
FIG. 3 is a diagram illustrating an embodiment of a memory cell array of FIG. 2.

FIG. 3 is a diagram illustrating an embodiment of the memory cell array of FIG. 2.

Referring to FIG. 3, the memory cell array 110 includes a plurality of memory blocks BLK1 to BLKz. Each memory block may have a three-dimensional structure. Each memory block includes a plurality of memory cells stacked on a substrate. Such plurality of memory cells are arranged along a +X direction, a +Y direction, and a +Z direction. A structure of each memory block is described in more detail with reference to FIGS. 4 and 5.

Figure 4:
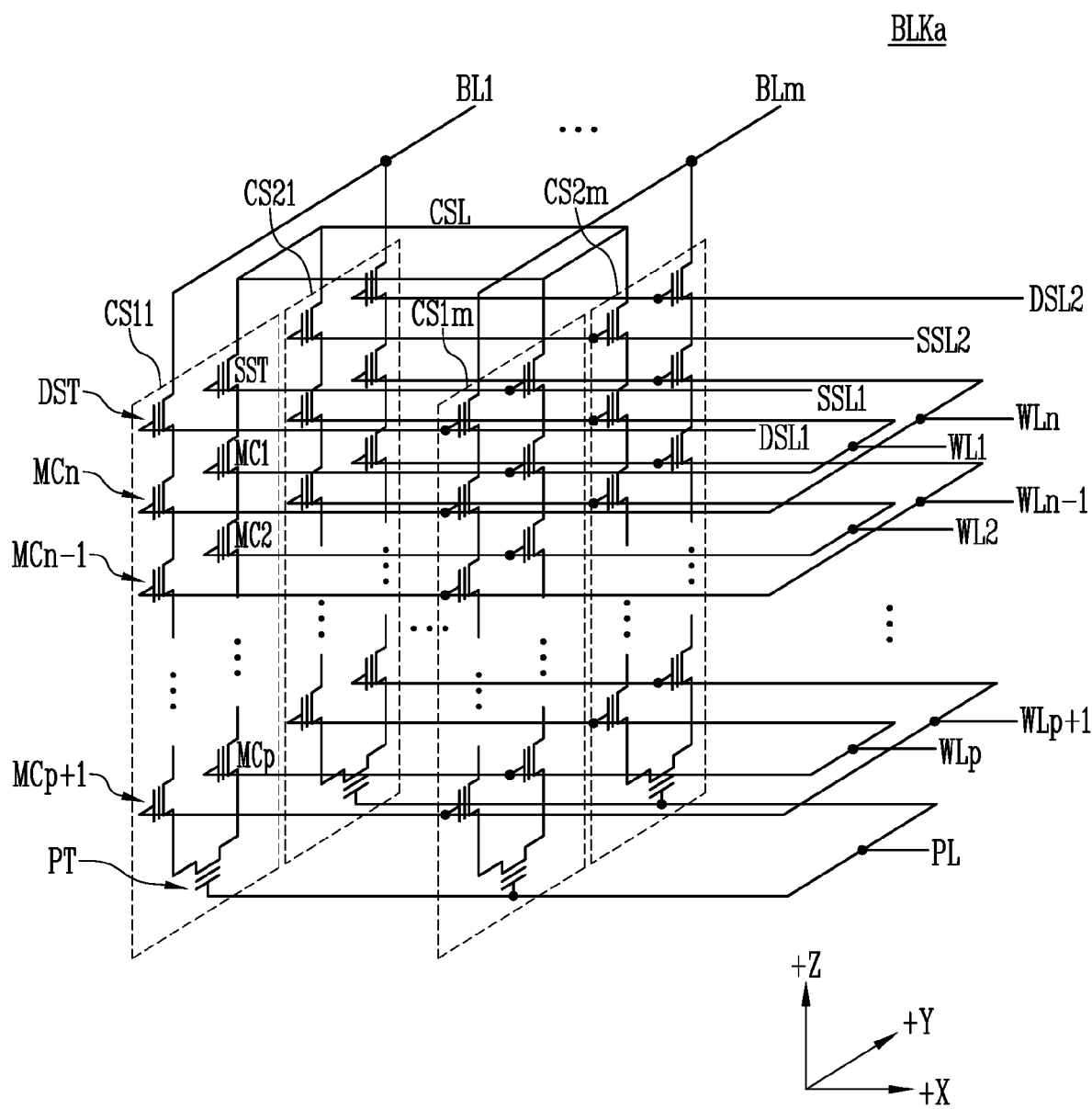
FIG. 4 is a circuit diagram illustrating any one memory block BLKa among memory blocks BLK1 to BLKz of FIG. 3.

FIG. 4 is a circuit diagram illustrating any one memory block BLKa among the memory blocks BLK1 to BLKz of FIG. 3.

Referring to FIG. 4, the memory block BLKa includes a plurality of cell strings CS11 to CS1*m* and CS21 to CS2*m*. In an embodiment, each of the plurality of cell strings CS11 to CS1*m* and CS21 to CS2*m* may be formed in a 'U' shape. In the memory block BLKa, m cell strings are arranged in a row direction (that is, the +X direction). In FIG. 4, two cell strings are arranged in a column direction (that is, the +Y direction). However, this is for convenience of description and it may be understood that three or more cell strings may be arranged in the column direction.

Each of the plurality of cell strings CS11 to CS1*m* and CS21 to CS2*m* includes at least one source select transistors SST, first to n-th memory cells MC1 to MCn, a pipe transistor PT, and at least one drain select transistor DST.

Each of the select transistors SST and DST and the memory cells MC1 to MCn may have a similar structure. In an embodiment, each of the select transistors SST and DST and the memory cells MC1 to MCn may include a channel layer, a tunneling insulating film, a charge storage film, and a blocking insulating film. In an embodiment, a pillar for providing the channel layer may be provided in each cell string. In an embodiment, a pillar for providing at least one of the channel layer, the tunneling insulating film, the charge storage film, and the blocking insulating film may be provided in each cell string.

The source select transistor SST of each cell string is connected between a common source line CSL and the memory cells MC1 to MCp.

In an embodiment, the source select transistors of the cell strings arranged in the same row are connected to a source select line extending in the row direction, and the source select transistors of the cell strings arranged in different rows are connected to different source select lines. In FIG. 4, the source select transistors of the cell strings CS11 to CS1*m* of a first row are connected to a first source select line SSL1. The source select transistors of the cell strings CS21 to CS2*m* of a second row are connected to a second source select line SSL2.

In another embodiment, the source select transistors of the cell strings CS11 to CS1*m* and CS21 to CS2*m* may be commonly connected to one source select line.

The first to n-th memory cells MC1 to MCn of each cell string are connected between the source select transistor SST and the drain select transistor DST.

The first to n-th memory cells MC1 to MCn may be divided into first to p-th memory cells MC1 to MCp and (p+1)-th to n-th memory cells MCp+1 to MCn. The first to p-th memory cells MC1 to MCp are sequentially arranged in a direction opposite to the +Z direction, and are connected in series between the source select transistor SST and the pipe transistor PT. The (p+1)-th to n-th memory cells MCp+1 to MCn are sequentially arranged in the +Z direction, and are connected in series between the pipe transistor PT and the drain select transistor DST. The first to p-th memory cells MC1 to MCp and the (p+1)-th to n-th memory cells MCp+1 to MCn are connected to each other through the pipe transistor PT. Gates of the first to n-th memory cells MC1 to MCn of each cell string are connected to the first to n-th word lines WL1 to WLn, respectively.

A gate of the pipe transistor PT of each cell string is connected to a pipeline PL.

The drain select transistor DST of each cell string is connected between a corresponding bit line and the memory cells MCp+1 to MCn. The drain select transistor of the cell strings arranged in the row direction are connected to the drain select line extending in the row direction. The drain select transistors of the cell strings CS11 to CS1$m$ of the first row are connected to a first drain select line DSL1. The drain select transistors of the cell strings CS21 to CS2$m$ of the second row are connected to a second drain select line DSL2.

The cell strings arranged in the column direction are connected to the bit lines extending in the column direction. In FIG. 4, the cell strings CS11 and CS21 of the first column are connected to the first bit line BL1. The cell strings CS1$m$ and CS2$m$ of the m-th column are connected to the m-th bit line BLm.

The memory cells connected to the same word line in the cell strings arranged in the row direction configure one page. For example, the memory cells connected to the first word line WL1, among the cell strings CS11 to CS1$m$ of the first row configure one page. The memory cells connected to the first word line WL1, among the cell strings CS21 to CS2$m$ of the second row configure another page. The cell strings arranged in one row direction may be selected by selecting any one of the drain select lines DSL1 and DSL2. One page of the selected cell strings may be selected by selecting any one of the word lines WL1 to WLn.

In another embodiment, even bit lines and odd bit lines may be provided instead of the first to m-th bit lines BL1 to BLm. In addition, even-numbered cell strings among the cell strings CS11 to CS1$m$ or CS21 to SC2$m$ arranged in the row direction may be connected to the even bit lines, respectively, and odd-numbered cell strings among the cell strings CS11 to CS1$m$ or CS21 to CS2$m$ arranged in the row direction may be connected to odd bit lines, respectively.

In an embodiment, at least one of the first to n-th memory cells MC1 to MCn may be used as a dummy memory cell. For example, at least one dummy memory cell is provided to reduce an electric field between the source select transistor SST and the memory cells MC1 to MCp. Alternatively, at least one or more dummy memory cells are provided to reduce an electric field between the drain select transistor DST and the memory cells MCp+1 to MCn. As more dummy memory cells are provided, reliability of an operation for the memory block BLKa is improved, however, the size of the memory block BLKa increases. As less memory cells are provided, the size of the memory block BLKa may be reduced, however, the reliability of the operation for the memory block BLKa may be reduced.

In order to efficiently control at least one dummy memory cell, each of the dummy memory cells may have a required threshold voltage. Before or after an erase operation for the memory block BLKa, program operations for all or a part of the dummy memory cells may be performed. When the erase operation is performed after the program operation is performed, the dummy memory cells may have the required threshold voltage by controlling a voltage applied to dummy word lines connected to the respective dummy memory cells.

Figure 5:
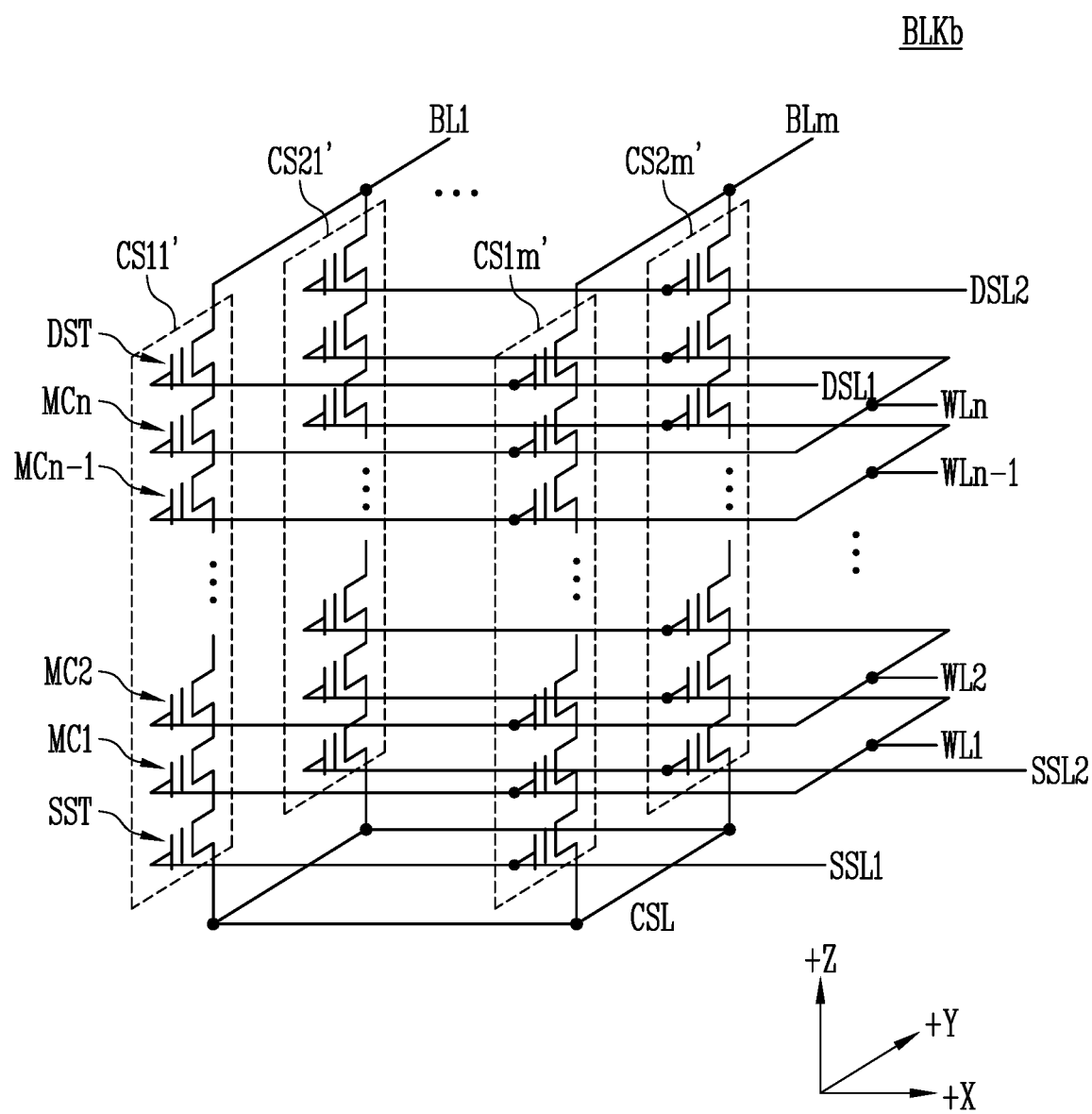
FIG. 5 is a circuit diagram illustrating another embodiment of any one memory block BLKb among the memory blocks BLK1 to BLKz of FIG. 3.

FIG. 5 is a circuit diagram illustrating another embodiment of any one memory block BLKb among the memory blocks BLK1 to BLKz of FIG. 3.

Referring to FIG. 5, the memory block BLKb includes a plurality of cell strings CS11' to CS1$m$' and CS21' to CS2$m$'. Each of the plurality of cell strings CS11' to CS1$m$' and CS21' to CS2$m$' extends along a +Z direction. Each of the plurality of cell strings CS11' to CS1$m$' and CS21' to CS2$m$' includes at least one source select transistor SST, first to n-th memory cells MC1 to MCn, and at least one drain select transistor DST stacked on a substrate (not shown) under the memory block BLK1'.

The source select transistor SST of each cell string is connected between a common source line CSL and memory cells MC1 to MCn. The source select transistors of the cell strings arranged in the same row are connected to the same source select line. The source select transistors of the cell strings CS11' to CS1$m$' arranged in a first row are connected to a first source select line SSL1. The source select transistors of the cell strings CS21' to CS2$m$' arranged in a second row are connected to a second source select line SSL2. In another embodiment, the source select transistors of the cell strings CS11' to CS1$m$' and CS21' to CS2$m$' may be commonly connected to one source select line.

The first to n-th memory cells MC1 to MCn of each cell string are connected in series between the source select transistor SST and the drain select transistor DST. Gates of the first to n-th memory cells MC1 to MCn are connected to first to the n-th word lines WL1 to WLn, respectively.

The drain select transistor DST of each cell string is connected between a corresponding bit line and the memory cells MC1 to MCn. The drain select transistors of the cell strings arranged in the row direction are connected to a drain select line extending in the row direction. The drain select transistors of the cell strings CS11' to CS1$m$' of a first row are connected to a first drain select line DSL1. The drain select transistors of the cell strings CS21' to CS2$m$' of a second row are connected to a second drain select line DSL2.

As a result, the memory block BLKb of FIG. 5 has an equivalent circuit similar to the memory block BLKa of FIG. 4 except that the pipe transistor PT is excluded from each cell string.

In another embodiment, even bit lines and odd bit lines may be provided instead of the first to m-th bit lines BL1 to BLm. In addition, even-numbered cell strings among the cell strings CS11' to CS1$m$' or CS21' to CS2$m$' arranged in the row direction may be connected to even bit lines, and odd-numbered cell strings among the cell strings CS11' to CS1$m$' or CS21' to CS2$m$' arranged in the row direction may be connected to odd bit lines, respectively.

In an embodiment, at least one of the first to n-th memory cells MC1 to MCn may be used as a dummy memory cell. For example, at least one dummy memory cell is provided to reduce an electric field between the source select transistor SST and the memory cells MC1 to MCn. Alternatively, at least one dummy memory cell is provided to reduce an electric field between the drain select transistor DST and the memory cells MC1 to MCn. As more dummy memory cells are provided, reliability of an operation for the memory block BLKb is improved, however, the size of the memory block BLKb increases. As less memory cells are provided, the size of the memory block BLKb may be reduced, however, the reliability of the operation for the memory block BLKb may be reduced.

In order to efficiently control at least one dummy memory cell, each of the dummy memory cells may have a required threshold voltage. Before or after an erase operation for the memory block BLKb, program operations for all or a part of the dummy memory cells may be performed. When the erase operation is performed after the program operation is performed, the dummy memory cells may have the required threshold voltage by controlling a voltage applied to the dummy word lines connected to the respective dummy memory cells.

Figure 6:
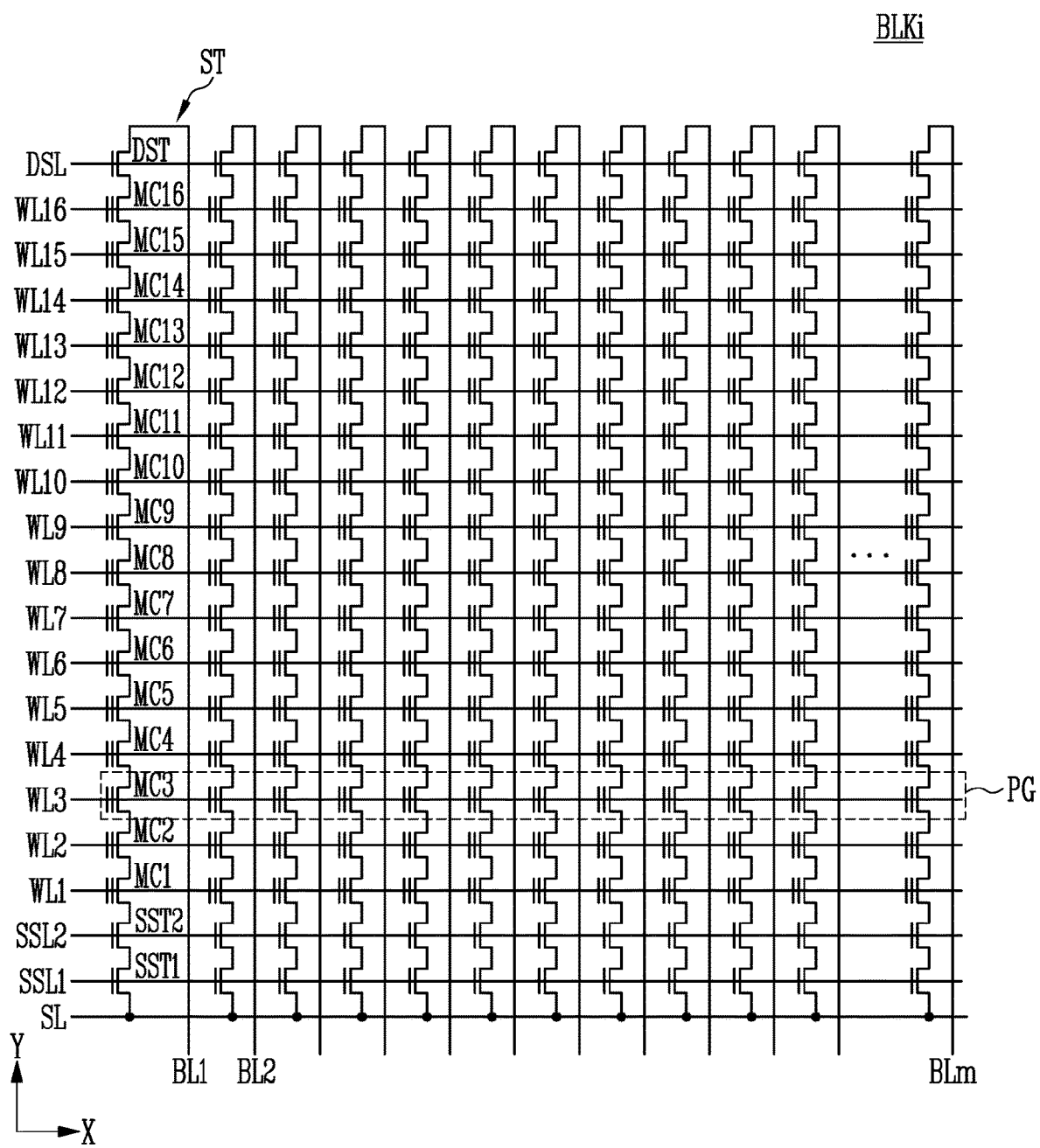
FIG. 6 is a circuit diagram illustrating still another embodiment of any one memory block BLKi among the memory blocks BLK1 to BLKz of FIG. 3.

FIG. 6 is a circuit diagram illustrating still another embodiment of any one memory block BLKi among the memory blocks BLK1 to BLKz of FIG. 3.

Referring to FIG. 6, a plurality of word lines arranged in parallel with each other may be connected between the first select line and the second select line. Here, the first select line may be the source select lines SSL1 and SSL2, and the second select line may be the drain select line DSL. More specifically, the memory block BLKl may include a plurality of strings ST connected between the bit lines BL1 to BLm and the source line SL. The bit lines BL1 to BLm may be connected to the strings ST, respectively, and the source line SL may be commonly connected to the strings ST. Since the strings ST may be configured to be identical to each other, a string ST connected to the first bit line BL1 will be specifically described, as an example.

The string ST may include source select transistors SST1 and SST2, a plurality of memory cells MC1 to MC16, and a drain select transistor DST connected in series between the source line SL and the first bit line BL1. One string ST may include at least one or more of the drain select transistors DST, and may include more source select transistors and memory cells than the number of the source select transistors SST1 and SST2 and the memory cells MC1 to MC16 shown in the drawing.

A source of the source select transistors SST1 and SST2 may be connected to the source line SL and a drain of the drain select transistor DST may be connected to the first bit line BL1. The memory cells MC1 to MC16 may be connected in series between the source select transistors SST1 and SST2 and the drain select transistor DST. Gates of the source select transistors SST1 and SST2 included in the different strings ST may be connected to the plurality of source select lines SSL1 and SSL2, respectively, gates of the drain select transistors DST may be connected to the drain select line DSL, and gates of the memory cells MC1 to MC16 may be connected to the plurality of word lines WL1 to WL16. A group of the memory cells connected to the same word line among the memory cells included in different strings ST may be referred to as a page PG. Therefore, the memory block BLKi may include the pages PG of the number of the word lines WL1 to WL16.

In an embodiment, the source select transistor SST1 adjacent to the source line SL among the source select transistors SST1 and SST2 may be connected to the first source select line SSL1. In this case, a capacitive coupling phenomenon may occur between the first source select line SSL1 and the source line SL. In addition, in an embodiment, the source select transistor SST2 that is not adjacent to the source line SL among the source select transistors SST1 and SST2 may be connected to the second source select line SSL2. In this case, a capacitive coupling phenomenon may not occur between the second source select line SSL2 and the source line SL. Meanwhile, more source select lines than the number of the source select lines SSL1 and SSL2 shown in the drawing, may be included.

One memory cell may store one bit of data. This is commonly called a single level cell (SLC). In this case, one physical page PG may store one logical page (LPG) data. The one logical page (LPG) data may include data bits of the same number as cells included in one physical page PG.

The one memory cell may store two or more bits of data. In this case, one physical page PG may store two or more logical page (LPG) data.

Figure 7:
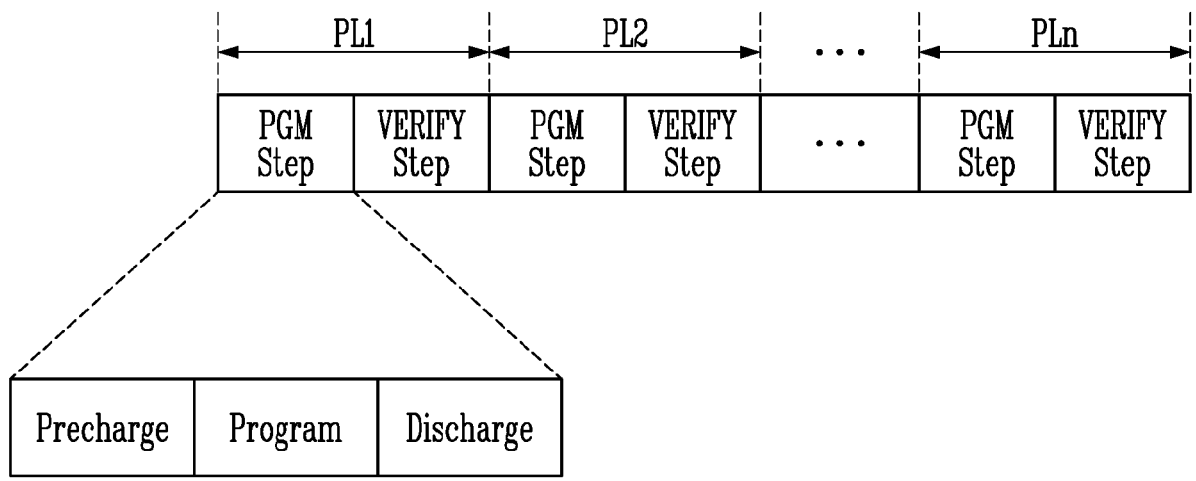
FIG. 7 is a diagram for describing a program operation of the memory device of FIG. 2.

FIG. 7 is a diagram for describing the program operation of the memory device of FIG. 2.

In FIG. 7, for convenience of description, each of the plurality of memory cells is a multi-level cell (MLC) that stores 2-bit data. However, the scope of the present disclosure is not limited thereto, and each of the plurality of memory cells may be a triple level cell (TLC) that stores 3-bit data or a quad level cell (QLC) that stores 4-bit data.

The program operation of the memory device 100 may include a plurality of program loops PL1 to PLn. That is, the memory device 100 may program selected memory cells to have a threshold voltage corresponding to any one of a plurality of program states by performing the plurality of program loops PL1 to PLn.

Each of the plurality of program loops PL1 to PLn may include a program step PGM Step of providing the program voltage and a verify step Verify Step of determining whether memory cells are programmed by applying the verify voltages.

The program step PGM Step included in each program loop may include a precharge period Precharge, a program period Program, and a discharge period Discharge.

The precharge period Precharge may be a period in which a source line and select lines are precharged. The memory device 100 may precharge the source line and the select lines by applying a precharge voltage to the source line and the select lines.

The program period Program may be a period in which the selected memory cell is programmed to have a threshold voltage corresponding to a program state. For example, the memory device 100 may apply the program voltage to a selected word line and apply a program pass voltage of a level lower than that of the program voltage to unselected word lines. In addition, the memory device 100 may apply a ground voltage corresponding to 0V to a selected bit line and apply a power voltage to an unselected bit line. Accordingly, the memory device 100 may cause the selected memory cell to have the threshold voltage corresponding to the program state.

The discharge period Discharge may be a period for discharging voltages applied to the word lines and the select lines. The memory device 100 may discharge the voltages applied to the word lines and the select lines by applying the ground voltage corresponding to 0V to the word lines and the select lines.

Figure 8:
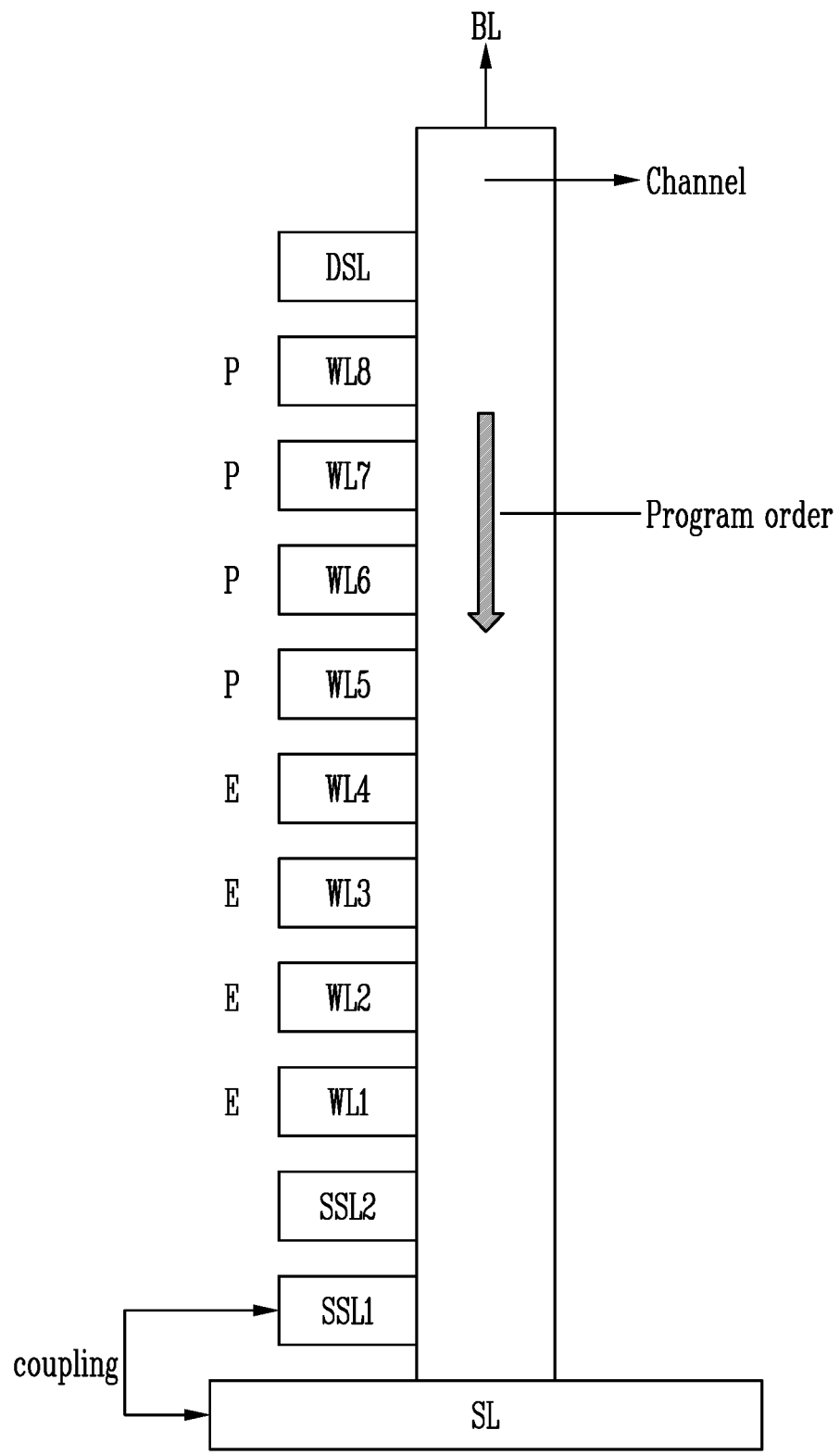
FIG. 8 is a diagram for describing an order in which memory cells included in the memory device of FIG. 2 are programmed.

FIG. 8 is a diagram for describing an order in which the memory cells included in the memory device of FIG. 2 are programmed.

In FIG. 8, an unselected memory cell string is shown. The memory cell string may include a plurality of memory cells connected in series between the bit line BL and the source line SL. The memory cells may be connected to the word lines, respectively. The drain select transistor may be connected between the memory cells and the bit line, and the source select transistor may be connected between the memory cells and the source line. The drain select transistor may be controlled through the drain select line, and the source select transistor may be controlled through the source select line.

For convenience of description, the memory cell string is connected to eight word lines WL1 to WL8. In addition, memory cells connected to the fifth to eighth word lines WL5 to WL8 are programmed memory cells, and memory cells connected to the first to fourth word lines WL1 to WL4 are memory cells before being programmed. In addition, the memory cell string includes the first source select line SSL1 adjacent to the source line SL and the second source select line SSL2 that is not adjacent to the source line SL.

In an embodiment, the program operation may be sequentially performed from the eighth word line WL8 adjacent to the drain select line DSL to the first word line WL1 adjacent to the source select lines SSL1 and SSL2. This is referred to as a reverse order. In this case, in the precharge period, the memory device 100 may precharge a channel of the memory cell string through the source line SL. The memory device 100 may precharge the unselected memory cell string before applying the program voltage in order to reduce a disturbance during the program operation. As a level of a voltage precharged to the source line SL increases, the disturbance may be further reduced.

Therefore, in an embodiment of the present disclosure, a memory device having a program operation speed to which an effect of a disturbance is reduced by precharging the source line SL in two steps in the precharge period, and a method of operating the memory device are provided.

Hereinafter, a program operation method according to an embodiment of the present disclosure is described in detail with reference to FIG. 9.

Figure 9:
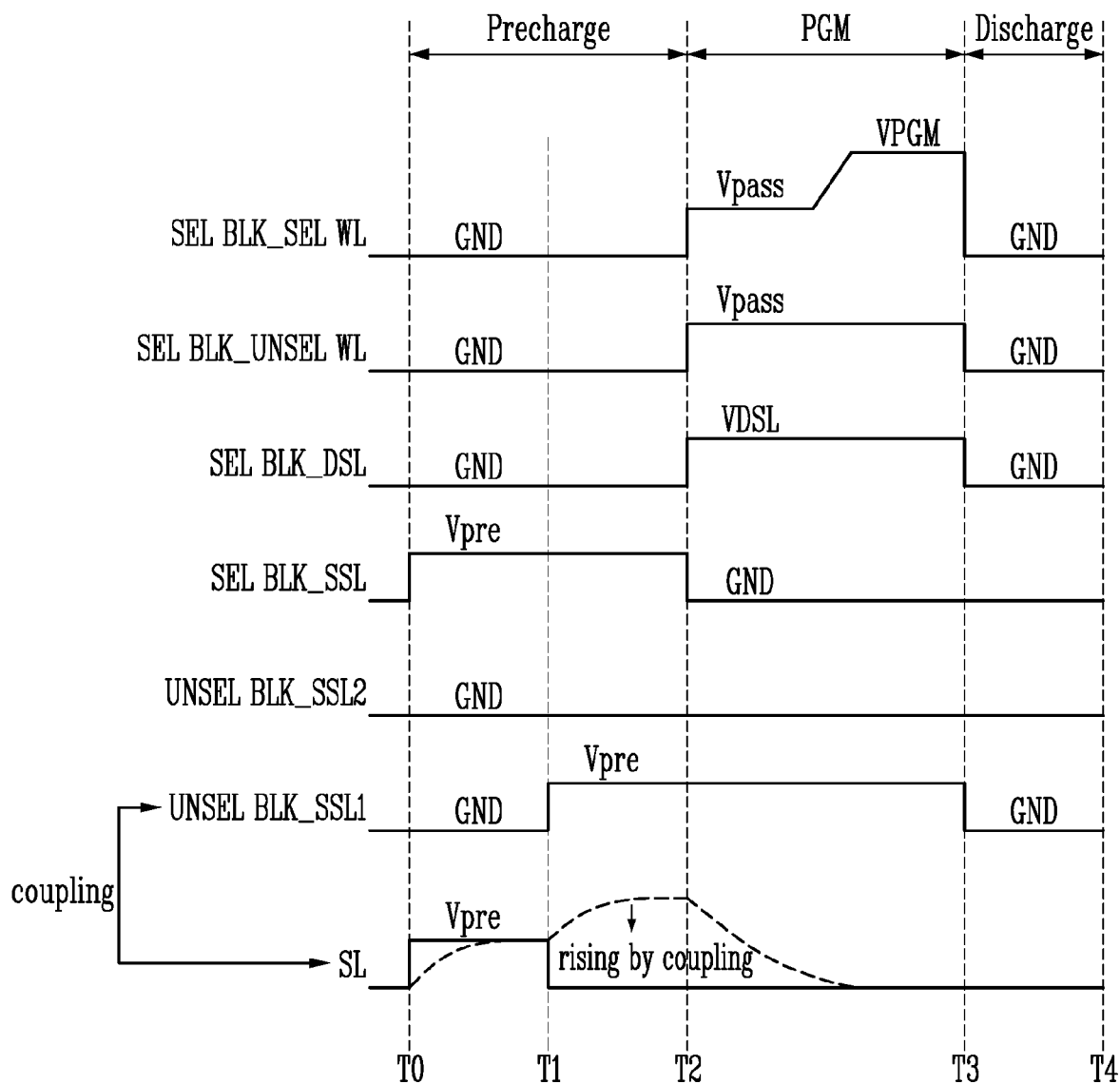
FIG. 9 is a waveform diagram for describing a method of operating a memory device according to an embodiment of the present disclosure.

FIG. 9 is a waveform diagram for describing a method of operating a memory device according to an embodiment of the present disclosure.

The method of FIG. 9 may be performed, for example, by the memory device 100 of FIGS. 1 and 2. For example, the memory device 100 may perform the method of FIG. 9 through the program operation controller 131 included in the control logic 130 of FIG. 2.

In FIG. 9, T0 to T4 represent the program step included in the program operation. The memory device 100 may perform the verify step after T4.

The program step may include the precharge period Precharge, the program period PGM, and the discharge period Discharge.

T0 to T2 may be the precharge period Precharge, T2 to T3 may be the program period PGM, and T3 to T4 may be the discharge period Discharge.

In FIG. 9, the memory device 100 sequentially performs the program operation in the reverse order from the word line adjacent to the drain select line to the word line adjacent to the source select lines, as described with reference to FIG. 8. Therefore, the memory cells connected to the unselected word lines positioned between the selected word line and the source select lines may be memory cells on which the program operation is not performed. In addition, the memory cells connected to the unselected word lines positioned between the selected word line and the drain select line may be memory cells on which the program operation is already performed.

In FIG. 9, the memory device 100 may include the first source select line connected to the source select transistor adjacent to the source line among the source select transistors. In this case, a capacitive coupling phenomenon may occur between the first source select line and the source line. In addition, the memory device 100 may include the second source select line connected to the source select transistor that is not adjacent to the source line among the source select transistors. Therefore, a capacitive coupling phenomenon may not occur between the second source select line and the source line.

In T0 to T1, the memory device 100 applies the precharge voltage Vpre to the source line SL. In an embodiment, the precharge voltage Vpre may be a voltage for charging the source line SL or the selected line in advance before applying the program voltage VPGM to reduce the disturbance generated during the program operation.

In an embodiment, the memory device 100 may apply the ground voltage GND to the first source select line UNSEL BLK_SSL1 connected to the source select transistor adjacent to the source line among the source select transistors included in the unselected memory block among the plurality of memory blocks, while the precharge voltage Vpre is applied to the source line SL.

In T1 to T2 after a reference time elapses from a time point at which the precharge voltage Vpre is applied to the source line SL, the memory device 100 may turn off a source line transistor connected to the source line SL. Accordingly, the memory device 100 may convert the source line SL precharged to a first voltage level into a floating state by turning off the source line transistor connected to the source line SL. In an embodiment, the reference time may be a time when a sufficient voltage is charged in the source line SL by the precharge voltage Vpre applied to the source line SL. For example, the reference time may be a time when the source line SL is precharged to the first voltage level by the precharge voltage Vpre applied to the source line SL. Specifically, the reference time may be a time from T0 to T1.

In T1 to T2, the memory device 100 applies the precharge voltage Vpre to the first source select line UNSEL BLK_SSL1 connected to the source select transistor adjacent to the source line SL among the source select transistors included in the unselected memory block among the plurality of memory blocks.

For example, in T1 to T2, the memory device 100 may apply the precharge voltage Vpre to the first source select line UNSEL BLK_SSL1 so that the source line SL is precharged to a second voltage level higher than the first voltage level. In T1 to T2, when the precharge voltage Vpre is applied to the first source select line UNSEL BLK_SSL1, a voltage level of the source line SL may increase due to the capacitive coupling phenomenon. In an embodiment, a magnitude of the voltage level increased by the capacitive coupling phenomenon may be determined based on a coupling ratio.

In T1 to T2 after the reference time elapses from the time point at which the precharge voltage Vpre is applied to the source line SL, the memory device 100 may apply the precharge voltage Vpre to the first source select line UNSEL BLK_SSL1. For example, in T1 to T2 after the reference time elapses from the time point at which the precharge voltage Vpre is applied to the source line SL, the memory device 100 may apply the precharge voltage Vpre to the first source select line UNSEL BLK_SSL1 that is in a ground state before T1.

Therefore, the memory device 100 may increase the voltage level charged in the source line SL through the capacitive coupling phenomenon by applying the precharge voltage Vpre to the first source select line UNSEL BLK_SSL1 adjacent to the source line SL after applying the precharge voltage Vpre to the source line SL. Accordingly, the memory device 100 may reduce the disturbance generated during the program operation.

During T0 to T2, the memory device 100 may apply the ground voltage GND to word lines SEL BLK_SEL WL and SEL BLK_UNSEL WL connected to the memory cells included in the selected memory block among the plurality of memory blocks. For example, in the precharge period, the memory device 100 may apply the ground voltage GND to the word lines SEL BLK_SEL WL and SEL BLK_UNSEL WL connected to the memory cells included in the selected memory block.

In addition, in T0 to T2, the memory device 100 may apply the precharge voltage Vpre to the source select line SEL BLK_SSL connected to the source select transistor included in the selected memory block among the plurality of memory blocks. For example, in the precharge period, the memory device 100 may apply the precharge voltage Vpre to the source select lines SEL BLK_SSL connected to the source select transistors included in the selected memory block. In T0 to T2, in an embodiment, the precharge voltage Vpre may be applied to the source select line SEL BLK_SSL connected to the source select transistor included in the selected memory block and the ground voltage GND may be applied to an unselected source select line (not shown) included in the selected memory block.

In addition, in T0 to T2, the memory device 100 may apply the ground voltage GND to the drain select line SEL BLK_DSL connected to the drain select transistor included in the selected memory block among the plurality of memory blocks. For example, in the precharge period, the memory device 100 may apply the ground voltage GND to the drain select lines SEL BLK_DSL connected to the drain select transistors included in the selected memory block. Therefore, in the precharge period, the memory device 100 may apply the ground voltage GND to the drain select line SEL BLK_DSL connected to the drain select transistor included in the selected memory block, and thus the channel of the memory cell string may be precharged through the voltage charged in the source line SL.

In addition, in T0 to T2, the memory device 100 may apply the ground voltage GND to the second source select line UNSEL BLK_SSL2 connected to the source select transistor that is not adjacent to the source line SL among the source select transistors included in the unselected memory block among the plurality of memory blocks. For example, in the precharge period, the memory device 100 may apply the ground voltage GND to the second source select line UNSEL BLK_SSL2.

Accordingly, the memory device 100 may block a connection between the source line SL and the memory cell string included in the unselected memory block by applying the ground voltage GND to the second source select line UNSEL BLK_SSL2. In addition, the memory device 100 may freely control the precharge voltage Vpre applied to the first source select line UNSEL BLK_SSL1 by blocking the connection between the memory cell string and the source line SL.

In T2 to T3, the memory device 100 may provide the program voltage to the selected memory block.

For example, the memory device 100 may provide the program voltage to the selected memory block after the source line SL is precharged to the second voltage level higher than the first voltage level by the precharge voltage Vpre applied to the first source select line UNSEL BLK_SSL1.

Specifically, in T2 to T3 after the precharge voltage Vpre is applied to the first source select line UNSEL BLK_SSL1, the memory device 100 may apply the program voltage VPGM to the selected word line SEL BLK_SEL WL connected to the memory cells included in the selected memory block. In addition, in T2 to T3, the memory device 100 may apply the pass voltage Vpass having the level lower than that of the program voltage VPGM to the unselected word line SEL BLK_UNSEL WL connected to the memory cells included in the selected memory block. Accordingly, the memory device 100 may cause the selected memory cell to have the threshold voltage corresponding to the program state.

In addition, during the period T2 to T3, the memory device 100 may apply the precharge voltage Vpre to the first source select line UNSEL BLK_SSL1 connected to the source select transistor adjacent to the source line SL among the source select transistors included in the unselected memory block and apply the ground voltage GND to the second source select line UNSEL BLK_SSL2 connected to the source select transistor that is not adjacent to the source line SL among the source select transistors included in the unselected memory block.

In addition, in T2 to T3, the memory device 100 may apply the ground voltage GND to the source select line SEL BLK_SSL connected to the source select transistor included in the selected memory block and apply a drain select voltage VDSL to the drain select line SEL BLK_DSL connected to the drain select transistor included in the selected memory block. The application of the ground voltage GND to the source select line SEL BLK_SSL and the drain select voltage VDSL to the drain select line SEL BLK_DSL may be for sequentially performing the program operation in the reverse order from the word line (e.g., the eighth word line WL8) adjacent to the drain select line SEL BLK_DSL to the word line (e.g., the first word line WL1) adjacent to the source select line SEL BLK_SSL, as described with reference to FIG. 8.

In T3 to T4, the memory device 100 may provide a discharge voltage to the selected memory block.

For example, in T3 to T4 after the program voltage VPGM is provided to the selected memory block, the memory device 100 may provide the discharge voltage to the selected memory block. In an embodiment, the discharge voltage may be the ground voltage GND for discharging the word lines SEL BLK_SEL WL and SEL BLK_UNSEL WL connected to the memory cells included in the selected memory block to 0V.

According to the embodiment of FIG. 9, the memory device 100 according to an embodiment of the present disclosure may precharge the voltage of the source line SL in two steps in the precharge period of the program step. That is, the memory device 100 may apply the precharge voltage Vpre to the source line SL, and then apply the precharge voltage Vpre to the first source select line UNSEL BLK_SSL1 adjacent to the source line SL. Accordingly, the source line SL may be precharged to have a high voltage level by a capacitive coupling phenomenon between the source line SL and the first source select line UNSEL BLK_SSL1.

Figure 10:
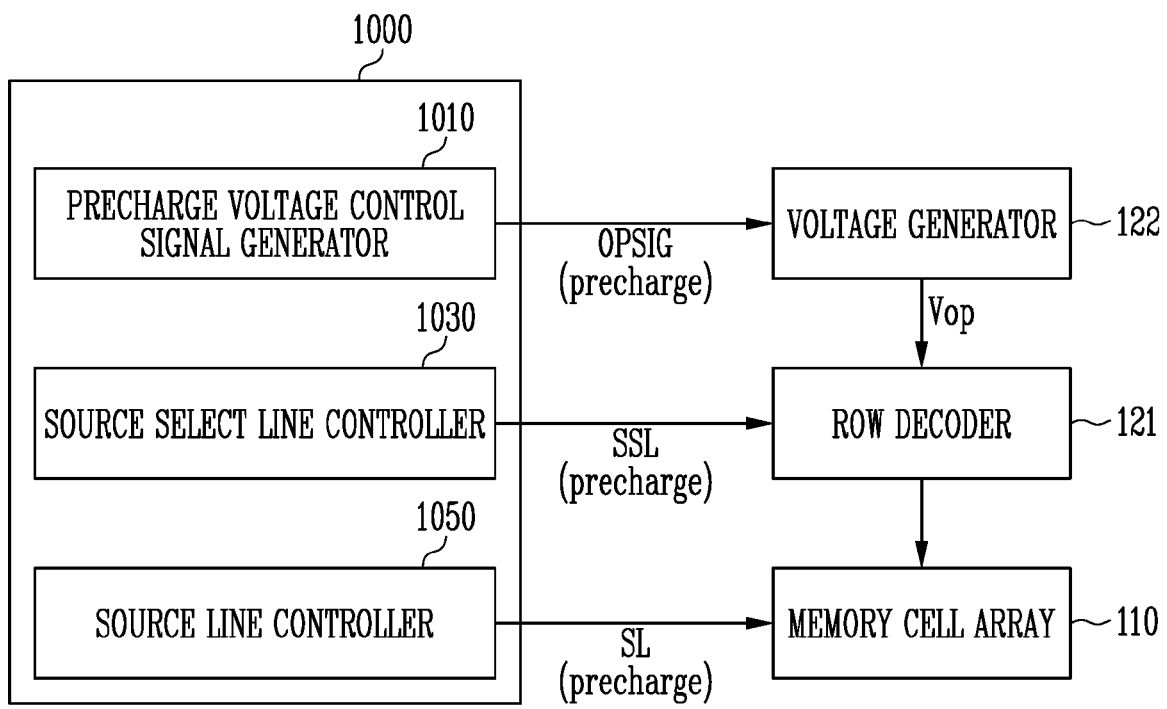
FIG. 10 is a block diagram for describing a configuration of a program operation controller included in a control logic of FIG. 2.

FIG. 10 is a block diagram for describing a configuration of the program operation controller included in the control logic of FIG. 2.

In FIG. 10, the memory device 100 may include a memory cell array 110, a row decoder 121, a voltage generator 122, and a program operation controller 1000. The memory cell array 110, the row decoder 121, and the voltage generator 122 may be configured and operated identically to the memory cell array 110, the row decoder 121, and the voltage generator 122 described with reference to FIG. 2, respectively. The program operation controller 1000 may indicate the program operation controller 131 of FIG. 2.

The program operation controller 1000 may be included in the control logic 130 described with reference to FIG. 2.

Referring to FIG. 10, the program operation controller 1000 may include a precharge voltage control signal generator 1010, a source select line controller 1030, and a source line controller 1050.

The precharge voltage control signal generator 1010 may generate a program voltage control signal instructing to generate a plurality of voltages used in the program step. For example, the precharge voltage control signal generator 1010 may generate a precharge voltage control signal OPSIG(precharge) for generating precharge related voltages, which are voltages of various levels used in the precharge period, and may provide the generated precharge voltage control signal OPSIG(precharge) to the voltage generator 122. The voltage generator 122 generates various precharge related voltages Vop used in the precharge period according to the precharge voltage control signal OPSIG (precharge), and may provide the generated precharge related voltages Vop to the row decoder 121.

The source line controller 1050 may control the precharge voltage applied to the source line. Specifically, the source line controller 1050 may apply a precharge voltage SL(precharge) to the source line of the memory cell array 110.

The source select line controller 1030 may control the voltage applied to the source select lines. Specifically, the source select line controller 1030 may provide a source select line control signal SSL(precharge), which is for applying the precharge voltage to the source select line, to the row decoder 121. The row decoder 121 may provide the precharge related voltages Vop generated by the voltage generator 122 to the memory cell array 110 according to the source select line control signal SSL(precharge).

Figure 11:
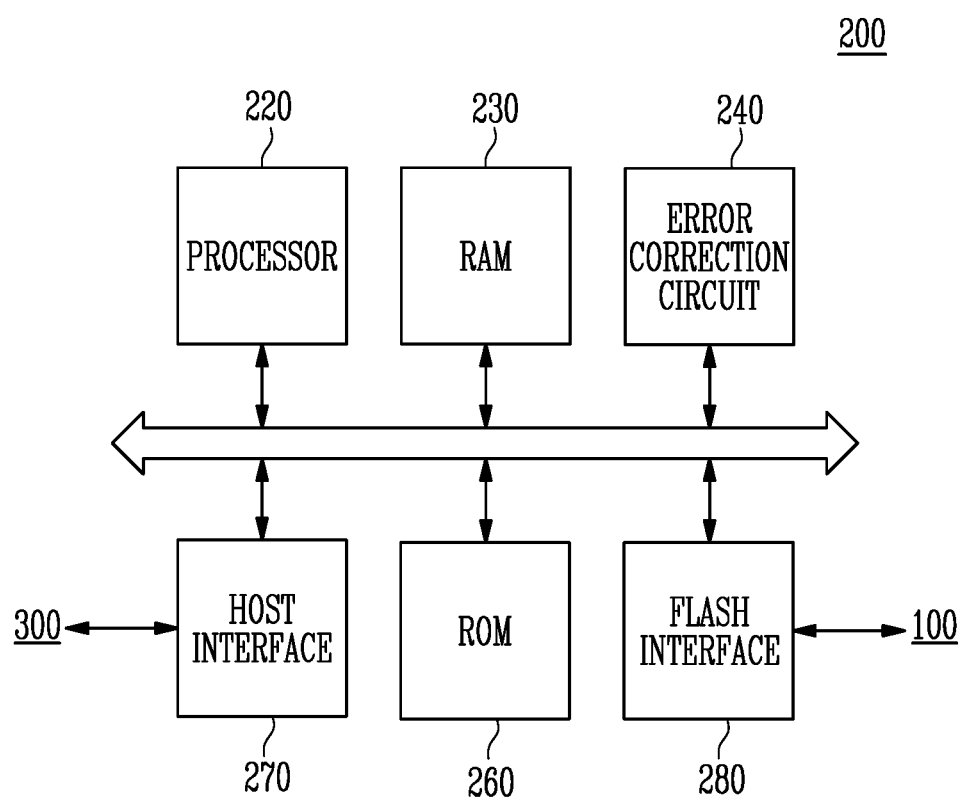
FIG. 11 is a diagram for describing a memory controller of FIG. 1.

FIG. 11 is a diagram for describing the memory controller of FIG. 1.

Referring to FIGS. 1 and 11, the memory controller 200 may include a processor 220, a RAM 230, an error correction circuit 240, a ROM 260, a host interface 270, and a flash interface 280.

The processor 220 may control an overall operation of the memory controller 200. The RAM 230 may be used as a buffer memory, a cache memory, an operation memory, and the like of the memory controller 200.

The ROM 260 may store various information required for the memory controller 200 to operate in a firmware form.

The memory controller 200 may communicate with an external device (for example, the host 300, an application processor, and the like) through the host interface 270.

The memory controller 200 may communicate with the memory device 100 through the flash interface 280. The memory controller 200 may transmit a command CMD, an address ADDR, a control signal CTRL, and the like to the memory device 100 and receive data DATA through the flash interface 280. For example, the flash interface 280 may include a NAND interface.

Figure 12:
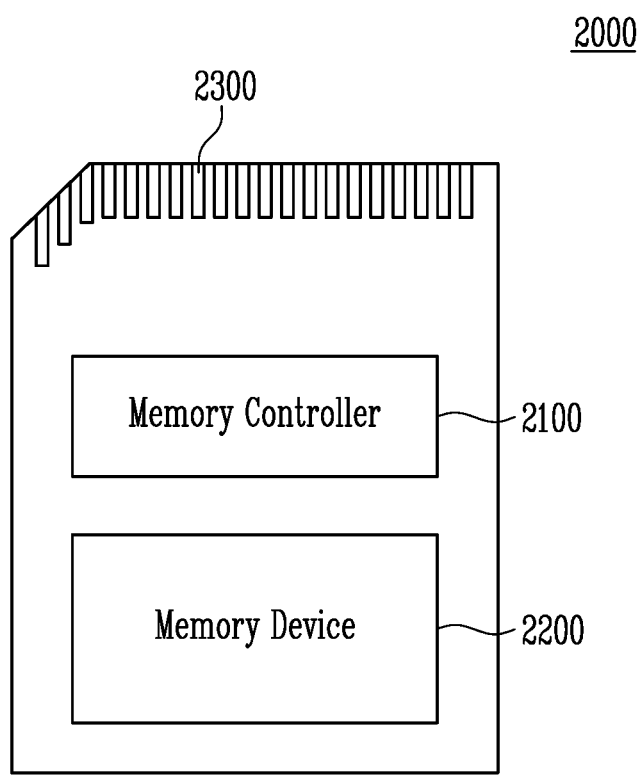
FIG. 12 is a block diagram illustrating a memory card system to which the storage device according to an embodiment of the present disclosure is applied.

FIG. 12 is a block diagram illustrating a memory card system to which the storage device according to an embodiment of the present disclosure is applied.

Referring to FIG. 12, the memory card system 2000 includes a memory controller 2100, a memory device 2200, and a connector 2300.

The memory controller 2100 is connected to the memory device 2200. The memory controller 2100 is configured to access the memory device 2200. For example, the memory controller 2100 may be configured to control read, write, erase, and background operations of the memory device 2200. The memory controller 2100 is configured to provide an interface between the memory device 2200 and a host. The memory controller 2100 is configured to drive firmware for controlling the memory device 2200. The memory controller 2100 may be implemented equally to the memory controller 200 described with reference to FIG. 1. The memory device 2200 may be implemented identically to the memory device 100 described with reference to FIG. 2.

For example, the memory controller 2100 may include components such as a random access memory (RAM), a processor, a host interface, a memory interface, and an error corrector.

The memory controller 2100 may communicate with an external device through the connector 2300. The memory controller 2100 may communicate with an external device (for example, the host) according to a specific communication standard. For example, the memory controller 2100 is configured to communicate with an external device through at least one of various communication standards such as a universal serial bus (USB), a multimedia card (MMC), an embedded MMC (MCM), a peripheral component interconnection (PCI), a PCI express (PCI-E), an advanced technology attachment (ATA), a serial-ATA, a parallel-ATA, a small computer system interface (SCSI), an enhanced small disk interface (ESDI), integrated drive electronics (IDE), FireWire, a universal flash storage (UFS), Wi-Fi, Bluetooth, and an NVMe. For example, the connector 2300 may be defined by at least one of the various communication standards described above.

For example, the memory device 2200 may be configured of various non-volatile memory elements such as an electrically erasable and programmable ROM (EEPROM), a NAND flash memory, a NOR flash memory, a phase-change RAM (PRAM), a resistive RAM (ReRAM), a ferroelectric RAM (FRAM), and a spin-torque magnetic RAM (STT-MRAM).

The memory controller 2100 and the memory device 2200 may be integrated into one semiconductor device to configure a memory card. For example, the memory controller 2100 and the memory device 2200 may be integrated into one semiconductor device to configure a memory card such as a PC card (personal computer memory card international association (PCMCIA)), a compact flash card (CF), a smart media card (SM or SMC), a memory stick, a multimedia card (MMC, RS-MMC, MMCmicro, or eMMC), an SD card (SD, miniSD, microSD, or SDHC), and a universal flash storage (UFS).

Figure 13:
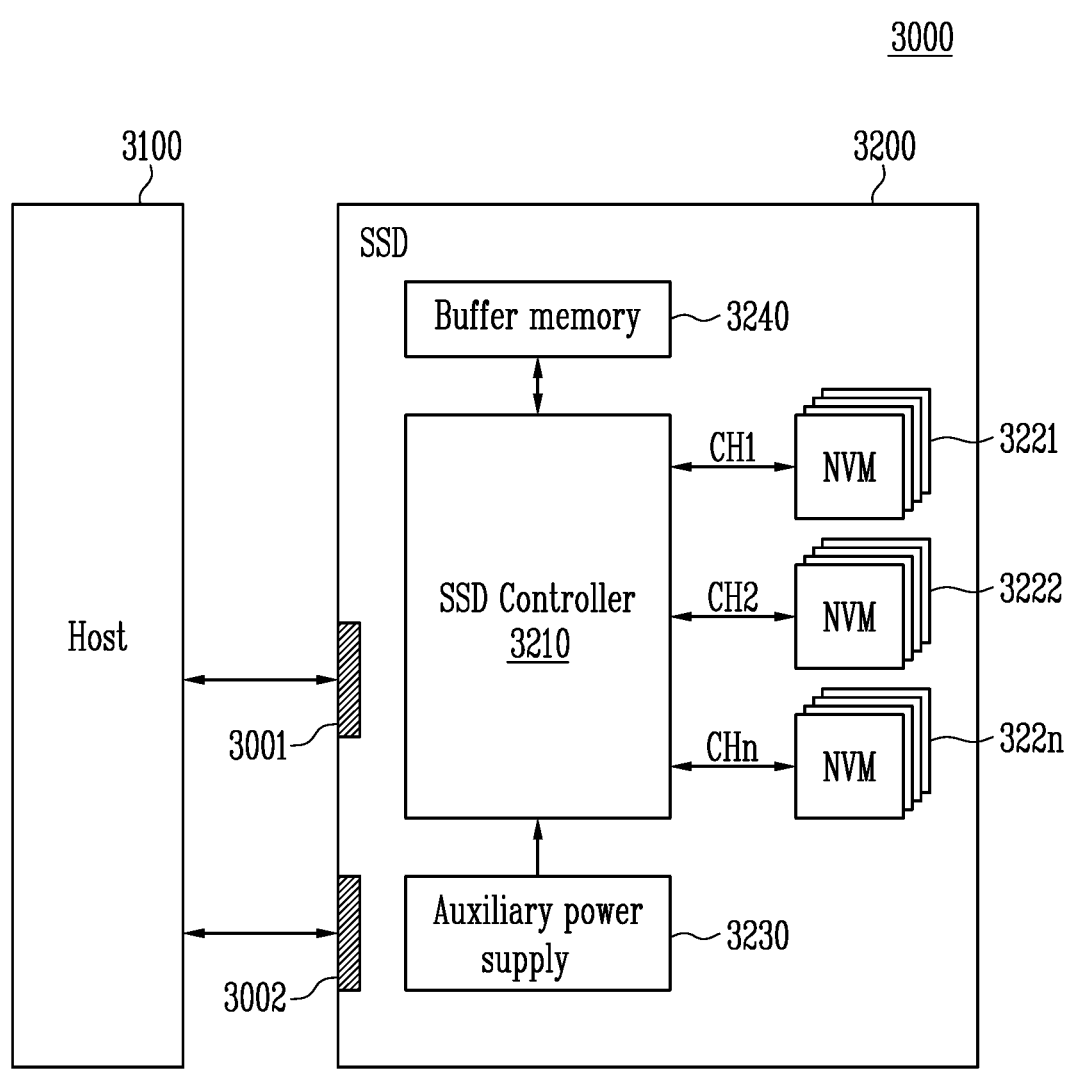
FIG. 13 is a block diagram illustrating a solid state drive (SSD) system to which the storage device according to an embodiment of the present disclosure is applied.

FIG. 13 is a block diagram illustrating a solid state drive (SSD) system to which the storage device according to an embodiment of the present disclosure is applied.

Referring to FIG. 13, the SSD system 3000 includes a host 3100 and an SSD 3200. The SSD 3200 exchanges a signal SIG with the host 3100 through a signal connector 3001 and receives power PWR through a power connector 3002. The SSD 3200 includes an SSD controller 3210, a plurality of flash memories 3221 to 322n, an auxiliary power device 3230, and a buffer memory 3240.

According to an embodiment of the present disclosure, the SSD controller 3210 may perform the function of the memory controller 200 described with reference to FIG. 1.

The SSD controller 3210 may control the plurality of flash memories 3221 to 322n in response to the signal SIG received from the host 3100. For example, the signal SIG may be signals based on an interface between the host 3100 and the SSD 3200. For example, the signal SIG may be a signal defined by at least one of interfaces such as a universal serial bus (USB), a multimedia card (MMC), an embedded MMC (MCM), a peripheral component interconnection (PCI), a PCI express (PCI-E), an advanced technology attachment (ATA), a serial-ATA, a parallel-ATA, a small computer system interface (SCSI), an enhanced small disk interface (ESDI), integrated drive electronics (IDE), FireWire, a universal flash storage (UFS), Wi-Fi, Bluetooth, and an NVMe.

The auxiliary power device 3230 is connected to the host 3100 through the power connector 3002. The auxiliary power device 3230 may receive the power PWR from the host 3100 and may charge the power. The auxiliary power device 3230 may provide power to the SSD 3200 when power supply from the host 3100 is not smooth. For example, the auxiliary power device 3230 may be positioned in the SSD 3200 or may be positioned outside the SSD 3200. For example, the auxiliary power device 3230 may be positioned on a main board and may provide auxiliary power to the SSD 3200.

The buffer memory 3240 operates as a buffer memory of the SSD 3200. For example, the buffer memory 3240 may temporarily store data received from the host 3100 or data received from the plurality of flash memories 3221 to 322n, or may temporarily store meta data (for example, a mapping table) of the flash memories 3221 to 322n. The buffer memory 3240 may include a volatile memory such as a DRAM, an SDRAM, a DDR SDRAM, an LPDDR SDRAM, and a GRAM, or a non-volatile memory such as an FRAM, a ReRAM, an STT-MRAM, and a PRAM.

Figure 14:
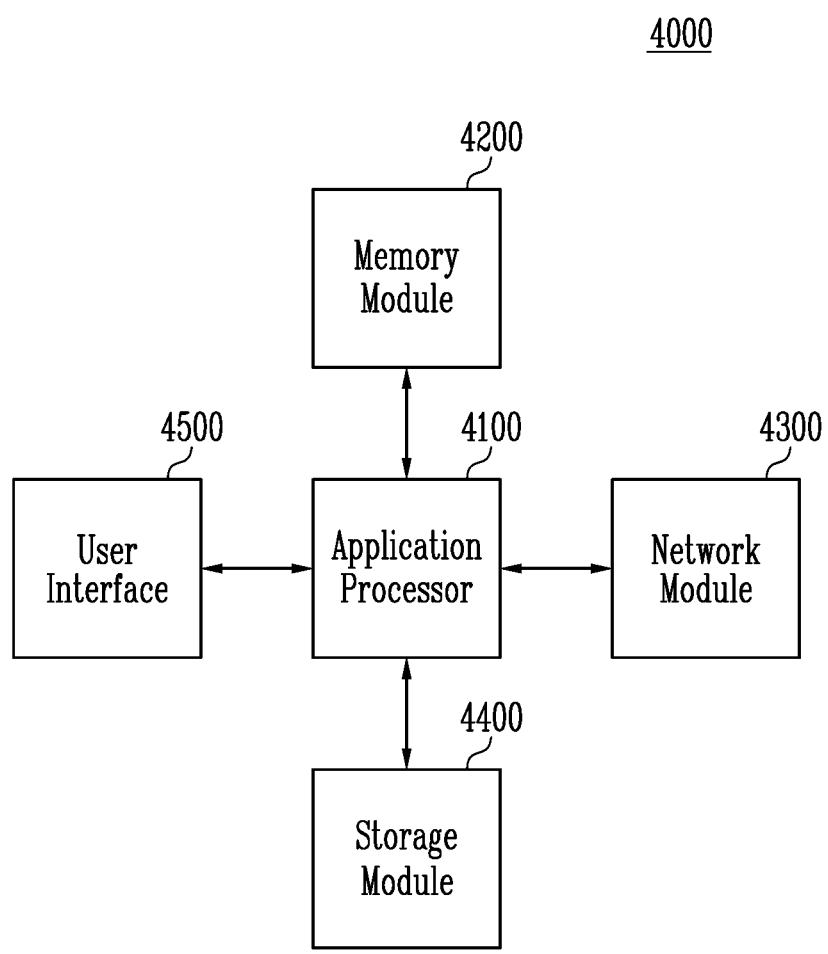
FIG. 14 is a block diagram illustrating a user system to which the storage device according to an embodiment of the present disclosure is applied.

FIG. 14 is a block diagram illustrating a user system to which the storage device according to an embodiment of the present disclosure is applied.

Referring to FIG. 14, the user system 4000 includes an application processor 4100, a memory module 4200, a network module 4300, a storage module 4400, and a user interface 4500.

The application processor 4100 may drive components, an operating system (OS), a user program, or the like included in the user system 4000. For example, the application processor 4100 may include controllers, interfaces, graphics engines, and the like that control the components included in the user system 4000. The application processor 4100 may be provided as a system-on-chip (SoC).

The memory module 4200 may operate as a main memory, an operation memory, a buffer memory, or a cache memory of the user system 4000. The memory module 4200 may include a volatile random access memory such as a DRAM, an SDRAM, a DDR SDRAM, a DDR2 SDRAM, a DDR3 SDRAM, an LPDDR SDARM, an LPDDR2 SDRAM, and an LPDDR3 SDRAM, or a non-volatile random access memory, such as a PRAM, a ReRAM, an MRAM, and an FRAM. For example, the application processor 4100 and memory module 4200 may be packaged based on a package on package (POP) and provided as one semiconductor package.

The network module 4300 may communicate with external devices. For example, the network module 4300 may support wireless communication such as code division multiple access (CDMA), global system for mobile communications (GSM), wideband CDMA (WCDMA), CDMA-2000, time division multiple access (TDMA), long term evolution, Wimax, WLAN, UWB, Bluetooth, and Wi-Fi. For example, the network module 4300 may be included in the application processor 4100.

The storage module 4400 may store data. For example, the storage module 4400 may store data received from the application processor 4100. Alternatively, the storage module 4400 may transmit data stored in the storage module 4400 to the application processor 4100. For example, the storage module 4400 may be implemented as a non-volatile semiconductor memory element such as a phase-change RAM (PRAM), a magnetic RAM (MRAM), a resistive RAM (RRAM), a NAND flash, a NOR flash, and a three-dimensional NAND flash. For example, the storage module 4400 may be provided as a removable storage device (removable drive), such as a memory card, and an external drive of the user system 4000.

For example, the storage module 4400 may include a plurality of non-volatile memory devices, and the plurality of non-volatile memory devices may operate identically to the memory device 100 described with reference to FIG. 1. The storage module 4400 may operate identically to the storage device 50 described with reference to FIG. 1.

The user interface 4500 may include interfaces for inputting data or an instruction to the application processor 4100 or for outputting data to an external device. For example, the user interface 4500 may include user input interfaces such as a keyboard, a keypad, a button, a touch panel, a touch screen, a touch pad, a touch ball, a camera, a microphone, a gyroscope sensor, a vibration sensor, and a piezoelectric element. The user interface 4500 may include user output interfaces such as a liquid crystal display (LCD), an organic light emitting diode (OLED) display device, an active matrix OLED (AMOLED) display device, an LED, a speaker, and a monitor.

What is claimed is:

1. A method of operating a memory device including a plurality of memory blocks each including a plurality of memory cell strings each including a plurality of memory cells connected in series between a bit line and a source line, a plurality of source select transistors connected in series between the source line and the plurality of memory cells, and a plurality of drain select transistors connected in series between the bit line and the plurality of memory cells, the method comprising:
applying a precharge voltage to the source line; and
applying the precharge voltage to a first source select line connected to a source select transistor adjacent to the source line among source select transistors included in an unselected memory block among the plurality of memory blocks.

2. The method of claim 1, wherein applying the precharge voltage to the first source select line comprises applying the precharge voltage to the first source select line after a reference time elapses from a time point at which the precharge voltage is applied to the source line.

3. The method of claim 2, wherein the applying of the precharge voltage to the first source select line further comprises turning off a source line transistor connected to the source line after the reference time elapses.

4. The method of claim 3, wherein the applying of the precharge voltage to the first source select line further comprises applying a ground voltage to the first source select line while the precharge voltage is applied to the source line.

5. The method of claim 4, wherein the applying of the precharge voltage to the first source select line further comprises applying the precharge voltage to the first source select line that is in a ground state, after the reference time elapses.

6. The method of claim 5, further comprising applying the ground voltage to a second source select line connected to a source select transistor that is not adjacent to the source line among the source select transistors included in the unselected memory block while the precharge voltage is applied to the source line and the first source select line.

7. The method of claim 1, further comprising applying the precharge voltage to source select lines connected to source select transistors included in a selected memory block among the plurality of memory blocks while the precharge voltage is applied to the source line and the first source select line.

8. The method of claim 7, further comprising applying the ground voltage to word lines connected to memory cells included in the selected memory block while the precharge voltage is applied to the source select lines connected to the source select transistors included in the selected memory block.

9. The method of claim 8, further comprising applying a program voltage to the selected memory block after the precharge voltage is applied to the first source select line.

10. The method of claim 9, further comprising providing a discharge voltage to the selected memory block after the program voltage is provided to the selected memory block.

11. A memory device comprising:
- a plurality of memory blocks each including a plurality of memory cell strings each including a plurality of memory cells connected in series between a bit line and a source line, a plurality of source select transistors connected in series between the source line and the plurality of memory cells, and a plurality drain select transistors connected in series between the bit line and the plurality of memory cells;
- a peripheral circuit configured to perform a plurality of program loops each including a program step of providing a program voltage to a selected memory block among the plurality of memory blocks and a verify step of verifying a program state of the selected memory block; and
- a program operation controller configured to control the peripheral circuit to apply a precharge voltage to the source line and apply the precharge voltage to a first source select line connected to a source select transistor adjacent to the source line among source select transistors included in an unselected memory block among the plurality of memory blocks in the program step.

12. The memory device of claim 11, wherein the program operation controller includes a program voltage control signal generator that generates a program voltage control signal instructing to generate a plurality of voltages used in the program step.

13. The memory device of claim 12, wherein the program operation controller further includes a source line controller that controls the precharge voltage applied to the source line.

14. The memory device of claim 13, wherein the program operation controller further includes a source select line controller that controls a voltage applied to the source select lines connected to the plurality of source select transistors.

15. A method of operating a memory device including a plurality of memory blocks each including a plurality of memory cell strings each including a plurality of memory cells connected in series between a bit line and a source line, a plurality of source select transistors connected in series between the source line and the plurality of memory cells, and a plurality of drain select transistors connected in series between the bit line and the plurality of memory cells, the method comprising:
- applying a precharge voltage to the source line; and
- applying the precharge voltage to a first source select line connected to a source select transistor adjacent to the source line among source select transistors included in an unselected memory block among the plurality of memory blocks, after the source line is precharged to a first voltage level.

16. The method of claim 15, wherein the applying of the precharge voltage to the first source select line comprises turning off a source line transistor connected to the source line after the source line is precharged to the first voltage level.

17. The method of claim 16, wherein the applying of the precharge voltage to the first source select line further comprises applying a ground voltage to the first source select line while the precharge voltage is applied to the source line.

18. The method of claim 17, wherein the applying of the precharge voltage to the first source select line further comprises applying the precharge voltage to the first source select line that is in a ground state, after the source line is precharged to the first voltage level.

19. The method of claim 18, further comprising applying the ground voltage to a second source select line connected to a source select transistor that is not adjacent to the source line among the source select transistors included in the unselected memory block while the pre-charge voltage is applied to the source line and the first source select line.

20. The method of claim 19, further comprising applying a program voltage to a selected memory block among the plurality of memory blocks after the source line is precharged to a second voltage level higher than the first voltage level.

* * * * *